United States Patent
Hueber et al.

(10) Patent No.: US 10,659,009 B2
(45) Date of Patent: May 19, 2020

(54) METHOD AND SYSTEM FOR ATTENUATOR PHASE COMPENSATION

(71) Applicant: NXP B.V., Eindhoven (NL)

(72) Inventors: Gernot Hueber, Linz (AT); Ian Thomas Macnamara, Graz (AT)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 15/224,933

(22) Filed: Aug. 1, 2016

(65) Prior Publication Data

US 2018/0034444 A1   Feb. 1, 2018

(51) Int. Cl.
*H03K 3/00* (2006.01)
*H03H 11/24* (2006.01)
*H03H 7/25* (2006.01)
*H03K 5/00* (2006.01)

(52) U.S. Cl.
CPC .............. *H03H 11/24* (2013.01); *H03H 7/25* (2013.01); *H03H 2210/017* (2013.01); *H03K 2005/00286* (2013.01)

(58) Field of Classification Search
CPC ......... H02J 7/025; G01V 3/30; H03H 11/245; H03F 1/0288; H03F 3/19; H03F 3/68; H03F 3/211
See application file for complete search history.

(56) References Cited

U.S. PATENT DOCUMENTS

| | | | |
|---|---|---|---|
| 10,019,608 B2 | 7/2018 | Neffe et al. | |
| 2004/0120420 A1* | 6/2004 | Hongo | H03F 1/02 375/297 |
| 2009/0028227 A1* | 1/2009 | Nouis | H04L 1/24 375/224 |
| 2009/0237218 A1 | 9/2009 | Kim | |
| 2014/0077874 A1* | 3/2014 | Ahmed | H03F 3/211 330/124 R |
| 2015/0171815 A1* | 6/2015 | Maxim | H03G 3/3042 455/127.2 |
| 2016/0094187 A1 | 3/2016 | Staudinger et al. | |
| 2016/0134259 A1 | 5/2016 | Shrivastava et al. | |
| 2016/0197718 A1 | 7/2016 | Michel et al. | |
| 2017/0288795 A1 | 5/2017 | Ding et al. | |
| 2017/0169258 A1 | 6/2017 | Neffe et al. | |
| 2018/0034621 A1 | 2/2018 | Hueber et al. | |

FOREIGN PATENT DOCUMENTS

| | | | |
|---|---|---|---|
| JP | H08-162886 | | 6/1996 |
| JP | H08162886 | * | 6/1996 |

OTHER PUBLICATIONS

Extended European Search Report for Patent Appln. No. 17182573.0 (dated Dec. 13, 2017).

* cited by examiner

*Primary Examiner* — Sibin Chen

(57) ABSTRACT

Embodiments of methods and systems for attenuator phase compensation are described. In an embodiment, a method for attenuator phase compensation involves determining a phase compensation value for an attenuator based on an attenuation configuration of the attenuator and performing phase compensation according to the phase compensation value to maintain a constant phase response.

15 Claims, 4 Drawing Sheets

METHOD AND SYSTEM FOR ATTENUATOR PHASE COMPENSATION

BACKGROUND

Attenuators can be used to reduce the amplitude of electronic signals. For example, a Radio frequency (RF) attenuator is used to reduce the amplitude of an RF signal. However, the settings of an attenuator can affect the phase response of the attenuator, which can negatively affect the performance of a corresponding communications device. For example, under certain attenuation settings, an Automatic gain control (AGC)-based RF attenuator can exhibit a non-constant phase response.

SUMMARY

Embodiments of methods and systems for attenuator phase compensation are described. In an embodiment, a method for attenuator phase compensation involves determining a phase compensation value for an attenuator based on an attenuation configuration of the attenuator and performing phase compensation according to the phase compensation value to maintain a constant phase response.

In an embodiment, determining the phase compensation value for the attenuator involves determining the phase compensation value for the attenuator from a predetermined table of different phase compensation values and attenuation configurations of the attenuator.

In an embodiment, determining the phase compensation value for the attenuator involves determining the phase compensation value for the attenuator based on a function of the attenuation configuration of the attenuator.

In an embodiment, the attenuation configuration of the attenuator includes an adjustable impedance value of the attenuator.

In an embodiment, determining the phase compensation value for the attenuator involves determining the phase compensation value for the attenuator from a predetermined table of different phase compensation values and adjustable impedance configurations of the attenuator based on the adjustable impedance value of the attenuator.

In an embodiment, the attenuation configuration of the attenuator includes an attenuation factor code of the attenuator.

In an embodiment, determining the phase compensation value for the attenuator involves determining the phase compensation value for the attenuator from a predetermined table of different phase compensation values and attenuation factor codes of the attenuator.

In an embodiment, determining the phase compensation value for the attenuator involves determining the phase compensation value for the attenuator based on a function of the attenuation factor code of the attenuator.

In an embodiment, a system for attenuator phase compensation includes a phase compensation determination unit configured to determine a phase compensation value for an attenuator based on an attenuation configuration of the attenuator and a phase compensation unit configured to perform phase compensation according to the phase compensation value to maintain a constant phase response.

In an embodiment, the phase compensation determination unit is further configured to determine the phase compensation value for the attenuator from a predetermined table of different phase compensation values and attenuation configurations of the attenuator.

In an embodiment, the phase compensation determination unit is further configured to determine the phase compensation value for the attenuator based on a function of the attenuation configuration of the attenuator.

In an embodiment, the attenuation configuration of the attenuator includes an adjustable impedance value of the attenuator.

In an embodiment, the phase compensation determination unit is further configured to determine the phase compensation value for the attenuator from a predetermined table of different phase compensation values and adjustable impedance configurations of the attenuator based on the adjustable impedance value of the attenuator.

In an embodiment, the attenuation configuration of the attenuator includes an attenuation factor code of the attenuator.

In an embodiment, the phase compensation determination unit is further configured to determine the phase compensation value for the attenuator from a predetermined table of different phase compensation values and attenuation factor codes of the attenuator.

In an embodiment, the phase compensation determination unit is further configured to determine the phase compensation value for the attenuator based on a function of the attenuation factor code of the attenuator.

In an embodiment, a method for attenuator phase compensation in a communications device that communicates via inductive coupling involves determining a phase compensation value for an attenuator that is located in a receiver path of the communications device based on an attenuation configuration of the attenuator and performing phase compensation according to the phase compensation value to maintain a constant phase response of the attenuator.

In an embodiment, determining the phase compensation value for the attenuator involves determining the phase compensation value for the attenuator from a predetermined table of different phase compensation values and attenuation configurations of the attenuator.

In an embodiment, determining the phase compensation value for the attenuator involves determining the phase compensation value for the attenuator based on a function of the attenuation configuration of the attenuator.

In an embodiment, the attenuation configuration of the attenuator includes an attenuation factor code of the attenuator.

Other aspects and advantages of embodiments of the present invention will become apparent from the following detailed description taken in conjunction with the accompanying drawings.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
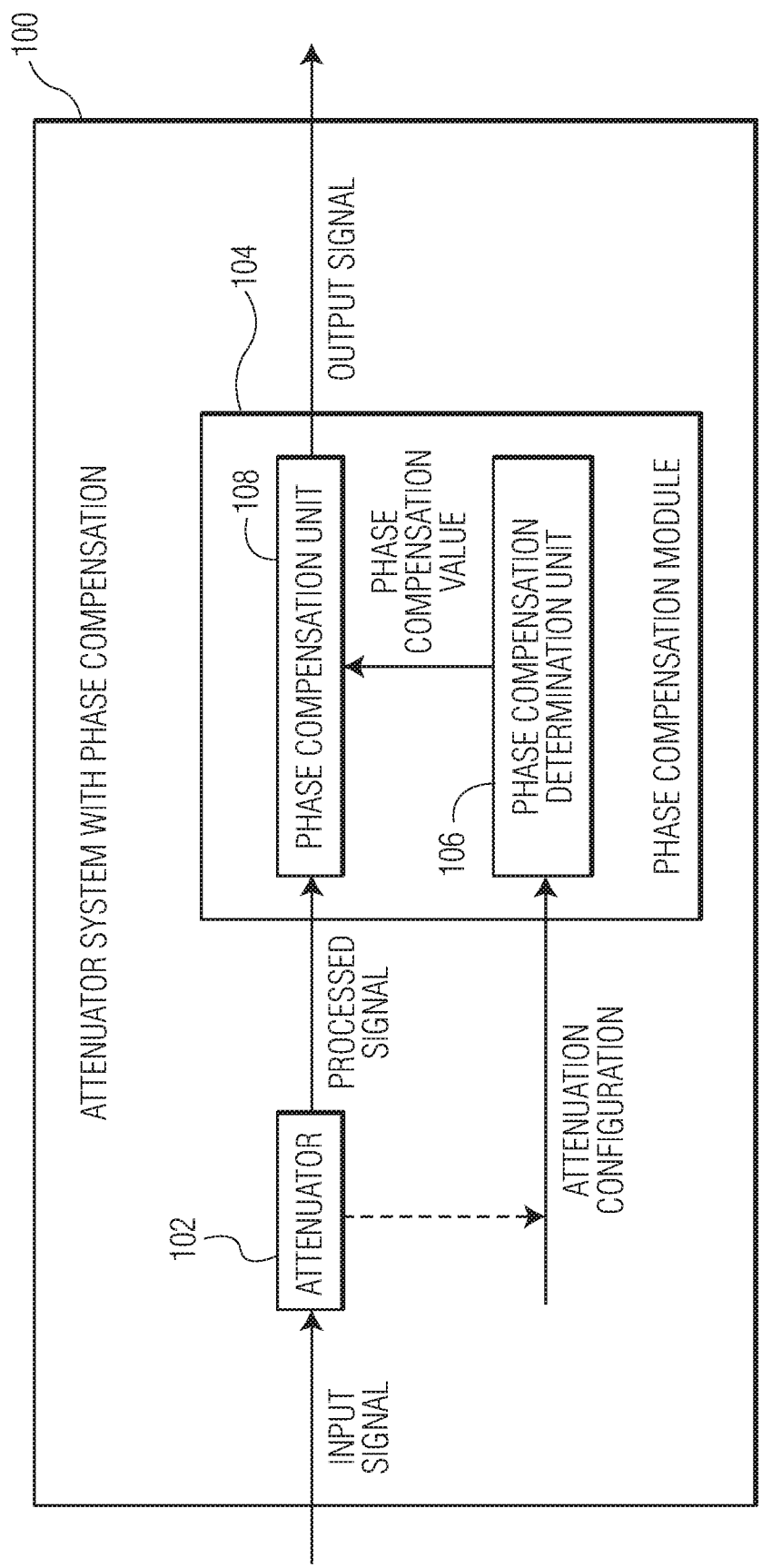
FIG. 1 is a functional block diagram of an attenuator system in accordance with an embodiment of the invention.

FIG. 1 is a functional block diagram of an attenuator system with phase compensation 100 in accordance with an embodiment of the invention. In the embodiment depicted in FIG. 1, the attenuator system includes an attenuator or a signal attenuation module 102 and a phase compensation module 104. The attenuator system may be an integrated circuit (IC) device or part of an IC device that includes additional components. The attenuator and the phase compensation module may be located on the same IC chip or on separate IC chips. Although the illustrated attenuator system is shown with certain components and described with certain functionality herein, other embodiments of the attenuator system may include fewer or more components to implement the same, less, or more functionality.

In the embodiment depicted in FIG. 1, the attenuator 102 is configured to process an input signal to generate a processed signal. The attenuator perform a signal attenuation operation in which the input signal is attenuated to generate an attenuated signal with an amplitude that is lower than the amplitude of the input signal and/or a signal bypass operation in which the input signal is not attenuated. For example, the attenuator is an RF attenuator that is used to reduce the amplitude of an RF input signal. The attenuator can be implemented as a programmable resistive voltage divider and/or a programmable capacitive voltage divider. Other implementations of the attenuator are possible.

The settings of the attenuator 102 can affect the phase response of the attenuator, which can negatively affect the performance of the attenuator system and a corresponding communications device that contains the attenuator system. For example, the attenuator may be located at a receiver (RX) path of a communications device. In this case, depending on an attenuator setting, the attenuator and thus the RX path of the communications device, may have a non-constant phase response. In the embodiment depicted in FIG. 1, the phase compensation module 104 is configured to perform phase compensation. For example, the phase compensation module can adjust at least one parameter associated with the attenuator system in order to maintain a constant phase response of the attenuator system. Examples of a parameter associated with the attenuator system include, without being limited to, a component of the attenuator system, a setting of the attenuator system, and a signal that is input into the attenuator system or output from the attenuator system. The phase response of the attenuator is the relationship between the phase of a signal that is input to the attenuator (input signal) and the phase of a signal that is output from the attenuator (output signal). The phase response of the attenuator can change when an attenuation configuration, e.g., the attenuation factor, of the attenuator is adjusted. In the embodiment depicted in FIG. 1, the phase compensation module obtains a phase offset/compensation value based on an attenuation configuration, e.g., the attenuation factor, of the attenuator. Consequently, a constant/linear phase response can be maintained in the attenuator system by compensating the phase response of the attenuator even if the amplitude of the input signal changes. By adjusting a parameter associated with the attenuator system, changes in the phase response of the attenuator can be compensated for to maintain a constant phase response of the attenuator system. Consequently, the performance of a corresponding communications device can be improved.

In some embodiments, the phase compensation module 104 includes a phase compensation determination unit 106 and a phase compensation unit 108. The phase compensation determination unit is configured to determine a phase compensation value based on an attenuation configuration of the attenuator 102. In an embodiment, the attenuation configuration of the attenuator is supplied to the phase compensation determination unit by the attenuator. Examples of the attenuation configuration include, without being limited to, the resistance value of the attenuator, the capacitance value of the attenuator and the attenuation factor code of the attenuator. The phase compensation determination unit may use the attenuation configuration of the attenuator as an index or a variable for a table (e.g., a lookup table) or a function to determine the phase compensation value. The phase compensation unit is configured to perform phase compensation of the phase response of the attenuator according to the phase compensation value to maintain a constant phase response of the attenuator.

The phase compensation unit 108 can compensate for the phase response of the attenuator 102 using various techniques. In an embodiment, the phase compensation unit adjusts a digital phase-locked loop (DPLL) setting of the attenuator system according to the phase compensation value to maintain a constant phase response for the attenuator system 100. In another embodiment, the phase compensation unit adjusts a clock management setting of the attenuator system according to the phase compensation value to maintain a constant phase response for the attenuator system. In yet another embodiment, the phase compensation unit implements a delay element (e.g., a delay line in a clock path of the attenuator system) according to the phase compensation value to maintain a constant phase response for the attenuator system.

Figure 2:
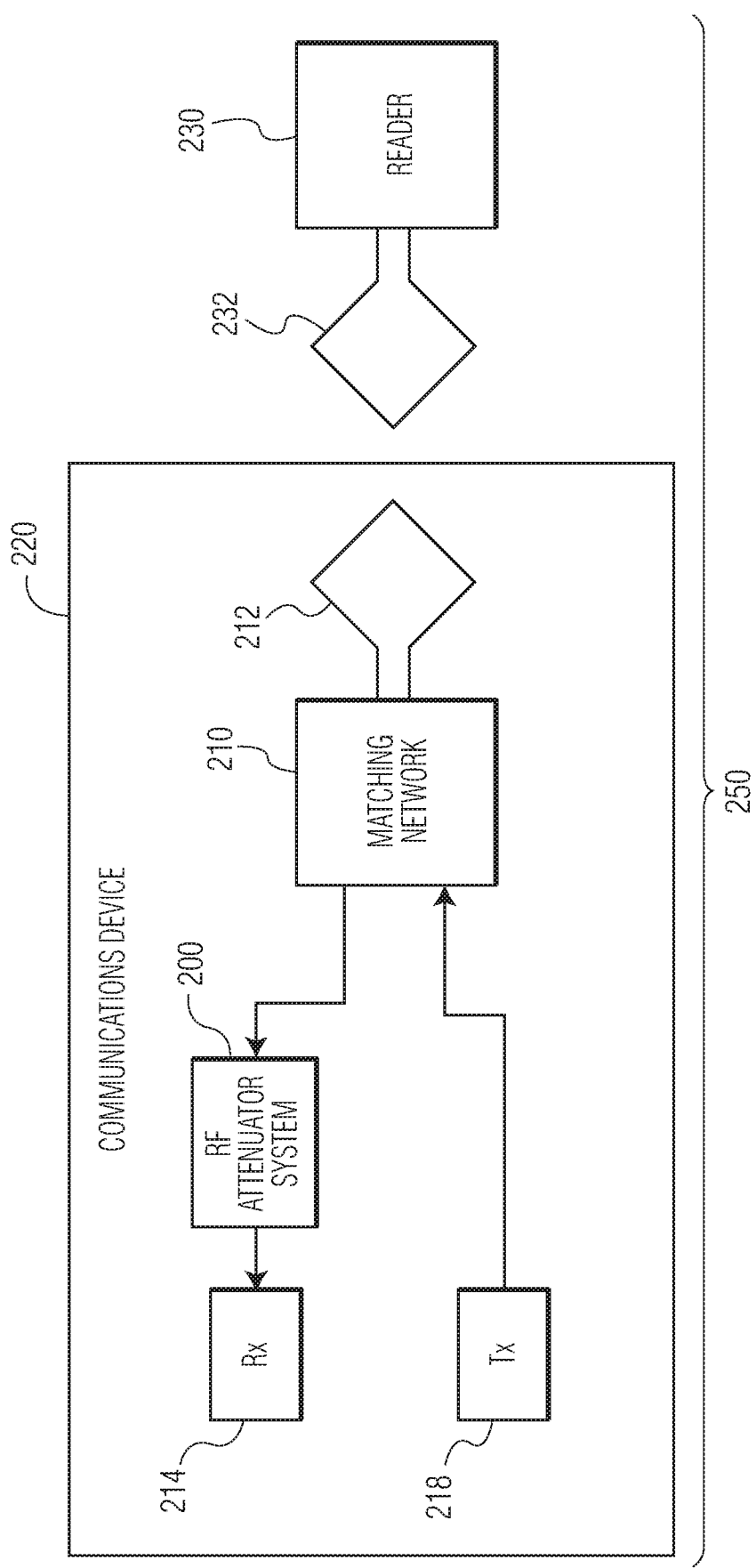
FIG. 2 depicts an embodiment of a communications device that can be used with a corresponding reader to form a communications system.

FIG. 2 depicts an embodiment of a communications device 220 that can be used with a corresponding reader 230 to form a communications system 250. The corresponding reader may be a dedicated reader device or a communications device in reader-mode. In the embodiment depicted in FIG. 2, the communications device includes an RF attenuator system 200, a matching network 210 that is coupled to an antenna 212, an analog receiver "RX" 214, and an analog transmitter "TX" 218. The RF attenuator system and the analog receiver are located in a receiver path of the communications device while the analog transmitter is located in a transmitter path of the communications device. In some embodiments, the communications device is implemented in a handheld computing system or a mobile computing system, such as a mobile phone. The communications device may be a near field communications (NFC) device that utilizes inductive coupling to communicate. In some embodiments, the communications device is implemented as an RF transponder compatible with the International Organization for Standardization (ISO)/the International Electrotechnical Commission (IEC) 14443 standard. Although the illustrated communications device is shown with certain components and described with certain functionality herein, other embodiments of the communications device may include fewer or more components to implement the same, less, or more functionality. In addition, the RF attenuator system depicted in FIG. 2 is one possible embodiment of the attenuator system 100 depicted in FIG. 1. However, the attenuator system depicted in FIG. 1 is not limited to the embodiment shown in FIG. 2.

In some embodiments, the communications system 250 is an inductively coupled communications system. In these embodiments, the antennas of the communications device 220 and the reader are induction type antennas such as loop antennas or coil-type antennas. In an example operation of the communications device, an RF signal is received by the antenna 212 via inductive coupling from the antenna 232 of the corresponding reader and is attenuated by the RF attenuator system 200. The attenuated RF signal is passed to the analog receiver 214 to convert the attenuated RF signal into a digital signal. An outgoing RF signal is generated at the analog transmitter 218, which is transmitted via inductive coupling using the antenna. In some embodiments, the communications device is an active load modulation (ALM) device. In such embodiments, the communications device can be configured to generate its own magnetic field for transmitting the outgoing RF using a current source, which results in greater communications distances.

The RF attenuator system 200 is configured to perform a signal attenuation operation in which an RF signal is attenuated and/or a signal bypass operation in which an RF signal is not attenuated. In some embodiments, the RF attenuator system is used to attenuate an incoming RF signal automatically or under device/human control if the RF signal is larger than a supply range (e.g., to maintain a constant output signal amplitude) and to generate an attenuation factor code that has M bits (where M is a positive integer). The attenuation factor code can be used by other circuits. For example, the attenuation factor code may be used by a received signal strength indicator (RSSI) device to generate an RSSI value. In some embodiments, the RF attenuator system is implemented as an impedance divider, a programmable resistive voltage divider, a programmable capacitive voltage divider, or a combination of a programmable resistive voltage divider and a programmable capacitive voltage divider.

In an example operation of the communications device 200, an RF signal is received by the antenna from an antenna 232 of the corresponding reader 230 and is attenuated by the RF attenuator system. The attenuated RF signal is passed to the analog receiver 214 to convert the attenuated RF signal into a digital signal. An outgoing RF signal is generated at the analog transmitter 218, which is transmitted via the antenna 212 to the reader.

Figure 3:
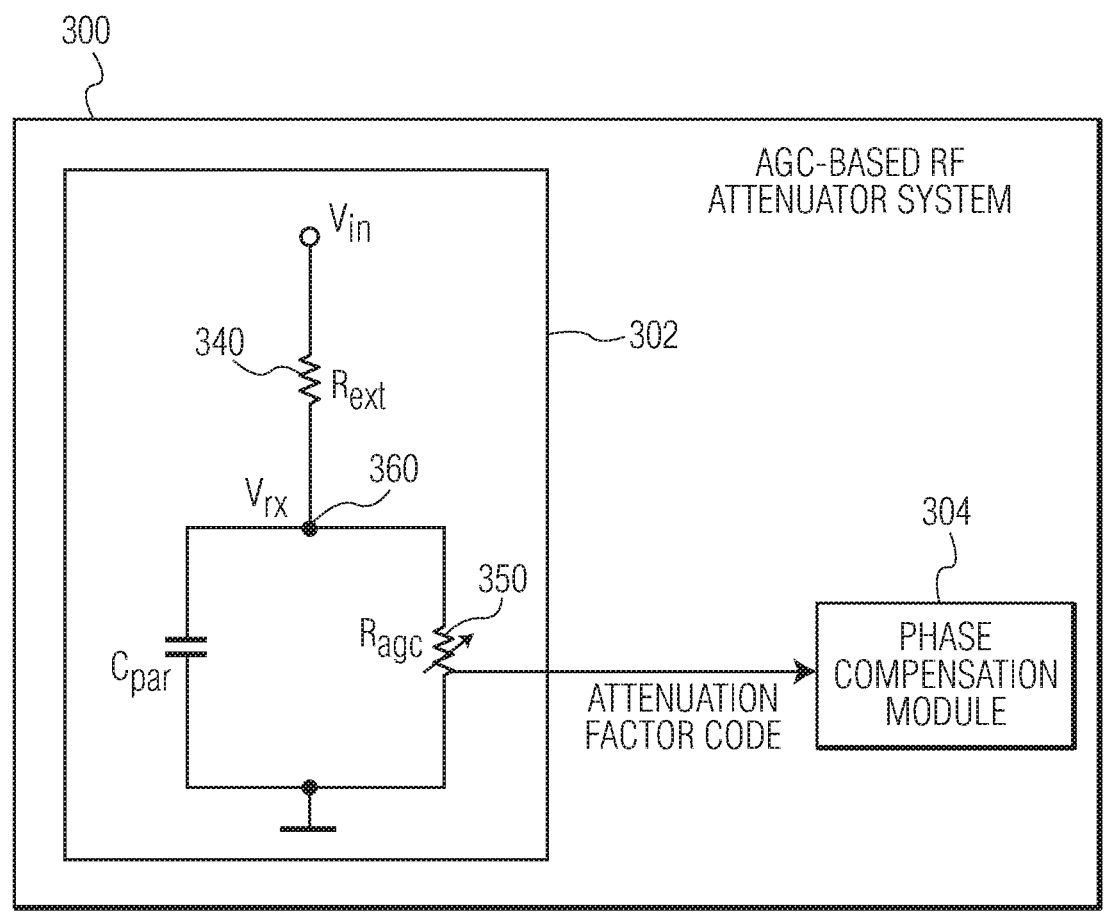
FIG. 3 depicts an embodiment of the RF attenuator system depicted in FIG. 2 that is implemented as an AGC-based RF attenuator.

FIG. 3 depicts an embodiment of the RF attenuator system depicted in FIG. 2 that is implemented as an AGC-based RF attenuator system 300. In the embodiment depicted in FIG. 3, the AGC-based RF attenuator system 300 is a programmable resistive voltage divider that includes a resistor 340 with a fixed external resistance, Rext, a tunable resistor 350 with a programmable resistance, Ragc, and a phase compensation module 304. The resistor 340 and the tunable resistor 350 form an AGC-based RF attenuator or a signal attenuation module 302. The AGC-based RF attenuator system 300 depicted in FIG. 3 is one possible embodiment of the RF attenuator system 200 depicted in FIG. 2. However, the RF attenuator system depicted in FIG. 2 is not limited to the embodiment shown in FIG. 3. For example, in some embodiments, the resistor 340 may have a programmable resistance. In other embodiment, instead of the resistor, a device with a programmable impedance may be used.

The AGC-based RF attenuator system 300 is used to attenuate an input signal into an output signal with lower amplitude (e.g., to provide a constant output signal amplitude or a relatively constant output signal amplitude within a threshold (e.g., within ±10%, 20% or other percentage of a predetermined output signal amplitude). For example, the AGC-based RF attenuator system can be used to attenuate an input voltage to generate a reference level and/or to regulate the input voltage to have a lower dynamic range. However, the AGC-based attenuator system may have a non-constant or nonlinear phase response depending on the components and the settings of the AGC-based attenuator 302. For example, different resistance values of the resistors 340 or 350 can affect the phase behavior of the AGC-based attenuator system.

In the embodiment depicted in FIG. 3, the AGC-based RF attenuator system 300 attenuates an input voltage, "Vin," into an attenuated voltage, "Vrx," by voltage division. A capacitance Cpar, which may be, for example, the chip pin capacitance or the substrate parasitic capacitance, is the capacitance coupled between the tunable resistor 350 and the attenuated voltage, Vrx. The division ratio can be adjusted by controlling the resistance value of the tunable resistor 350. In the AGC-based RF attenuator system depicted in FIG. 3, the resistor 340 is connected to the input terminal from which the input voltage, Vin, is received and the tunable resistor 350 is connected to ground. Alternatively, the tunable resistor 350 may be connected to the input terminal from which the input voltage, Vin, is received and the resistor 340 is connected to ground. The voltage division ratio of the AGC-based RF attenuator system is adjusted by changing the resistance of the tunable resistor 350.

In some embodiments, the resistance, Ragc, of the tunable resistor, 350, is controlled by an attenuation factor code. The tunable resistor 350 may include a number of resistors and each of the resistors can be enabled or disabled (e.g., bypassed) by the attenuation factor code to generate a particular resistance value. In an embodiment, the phase compensation module 304 maps the attenuation factor code of the AGC-based RF attenuator system 300 to a phase compensation value using a table (e.g., a look-up table (LUT)), a function, or a combination of a table and a function.

In some embodiments, the phase compensation module 304 determines the phase compensation value from a predetermined table of different phase compensation values and attenuation factor codes of the AGC-based RF attenuator system 300. Table 1A provides an example of a mapping between the attenuation factor code of the AGC-based RF attenuator system and the phase compensation value as a LUT while Table 1B provides some example values. Attenuation factor code values provided in the Table 1A and Table 1B can be approximated, rounded, or interpolated. In an embodiment, the resistance value, Ragc, of the tunable resistor 350 is monotonic with respect to the attenuation factor code. The resistance value, Ragc, of the tunable resistor 350 may be linear or nonlinear with respect to the attenuation factor code. The phase compensation module can compensate for the phase response of the AGC-based RF attenuator system using various techniques. In an embodiment, the phase compensation unit adjusts a DPLL setting of the AGC-based RF attenuator system according to the phase compensation value to maintain a constant phase response of the AGC-based RF attenuator system. In another embodiment, the phase compensation unit adjusts a clock management setting of the AGC-based RF attenuator system according to the phase compensation value to maintain a constant phase response of the AGC-based RF attenuator system. In yet another embodiment, the phase compensation unit implements or adjusts a delay element according to the phase compensation value to maintain a constant phase response of the AGC-based RF attenuator system. For example, for a phase compensation value of 27 degree, the phase compensation unit sets a delay element that is connected in serial with the AGC-based RF attenuator 302 with a first delay duration. For a phase compensation value of 10 degrees, the phase compensation unit sets the delay element with a second delay duration, which is smaller than the first delay duration.

TABLE 1A

| Attenuation Factor Code | Resistance (ohms) | Phase Compensation (Degree) |
| --- | --- | --- |
| AGC_0 | R_0 | Phase_0 |
| AGC_1 | R_1 | Phase_1 |
| AGC_2 | R_2 | Phase_2 |
| AGC_3 | R_3 | Phase_3 |
| AGC_4 | R_4 | Phase_4 |
| ... | ... | ... |
| AGC_N | R_N | Phase_N |

TABLE 1B

| Attenuation Factor Code | Resistance (ohms) | Phase Compensation (Degree) |
| --- | --- | --- |
| 0 | 100,00 | 27 |
| 50 | 5,000 | 23 |
| 100 | 2,000 | 17 |
| 150 | 1,000 | 12 |
| 200 | 500 | 10 |
| ... | ... | ... |
| 1023 | 40 | 0 |

In some embodiments, the phase compensation module 304 determines the phase compensation value for the AGC-based RF attenuator system 300 based on a function of the attenuation factor code of the AGC-based RF attenuator 302. For example, the impedance at the node 360, at which the voltage, Vrx, is output can be expressed as:

$$Z_{agc} = \frac{1}{\frac{1}{R_{agc}} + i2\pi f C_{agc}}, \quad (1)$$

where Zagc represents the impedance Z at the node 360, Ragc represents the resistance value of the tunable resistor 350, Cagc represents all capacitances from Vrx to ground, including e.g., the parasitic capacitance Cpar coupled between the tunable resistor 350 and the attenuated voltage, Vrx, and capacitances of switches within the tunable resistor 350. The transfer function of the AGC-based RF attenuator 302 can be expressed as:

$$H_{agc} = \frac{Z_{agc}}{Z_{agc} + R_{ext}}, \quad (2)$$

where Hagc represents the transfer function of the AGC-based RF attenuator 302 and Rext represents the resistance value of the resistor 340. Hence, the phase of the transfer function of the AGC-based RF attenuator 302 can be expressed as:

$$\phi_{agc} = \arg(H_{agc}) = \arctan\left(\frac{\text{Im}(H_{agc})}{\text{Re}(H_{agc})}\right), \quad (3)$$

where φagc represents the phase of the transfer function of the AGC-based RF attenuator 302. Based on the above equation (3), the phase of the transfer function of the AGC-based RF attenuator 302 under different attenuation factor codes can be obtained and the difference between the phase of the transfer function of the AGC-based RF attenuator 302 under different attenuation factor codes can be calculated by the phase compensation module. The phase compensation module can adjust a DPLL setting or a clock management setting of the AGC-based RF attenuator system 300 and/or implement or adjust a delay element to compensate for the phase difference of the transfer function of the AGC-based RF attenuator 302 under different attenuation factor codes. Consequently, a constant phase response of the AGC-based RF attenuator system 300 can be maintained.

Figure 4:
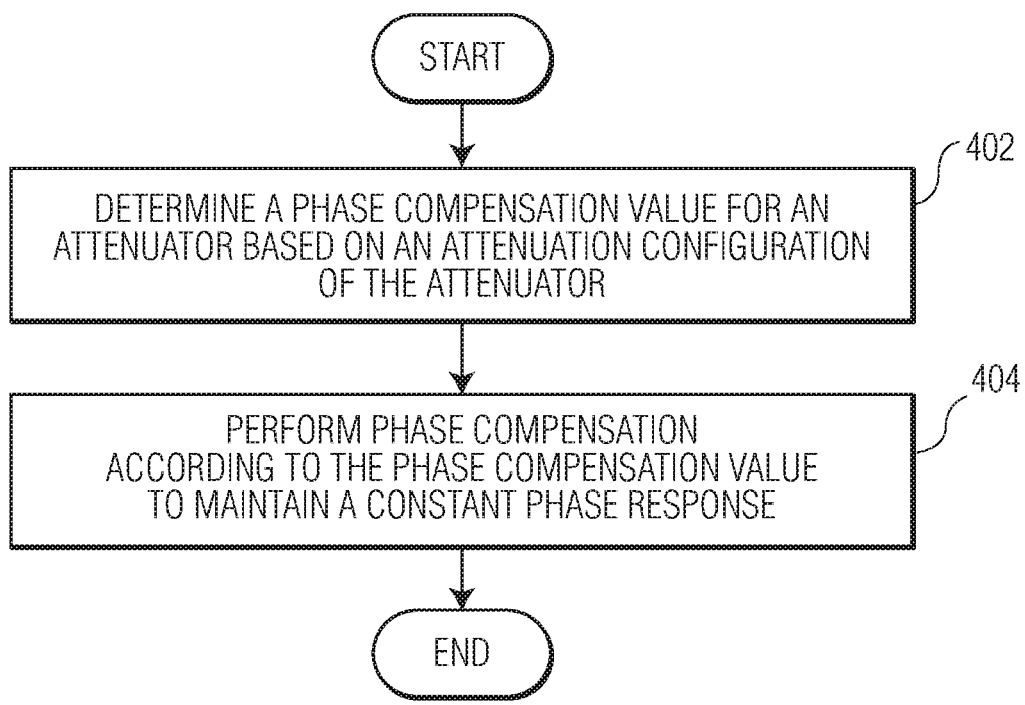
FIG. 4 is a process flow diagram of a method for attenuator phase compensation in accordance with an embodiment of the invention.

FIG. 4 is a process flow diagram of a method for attenuator phase compensation in accordance with an embodiment of the invention. At block 402, a phase compensation value for an attenuator is determined based on an attenuation configuration of the attenuator. At block 404, phase compensation is performed according to the phase compensation value to maintain a constant phase response. The attenuator may be the same or similar to the attenuator 102 depicted in FIG. 1 and/or the AGC-based RF attenuator 302 depicted in FIG. 3.

Figure 5:
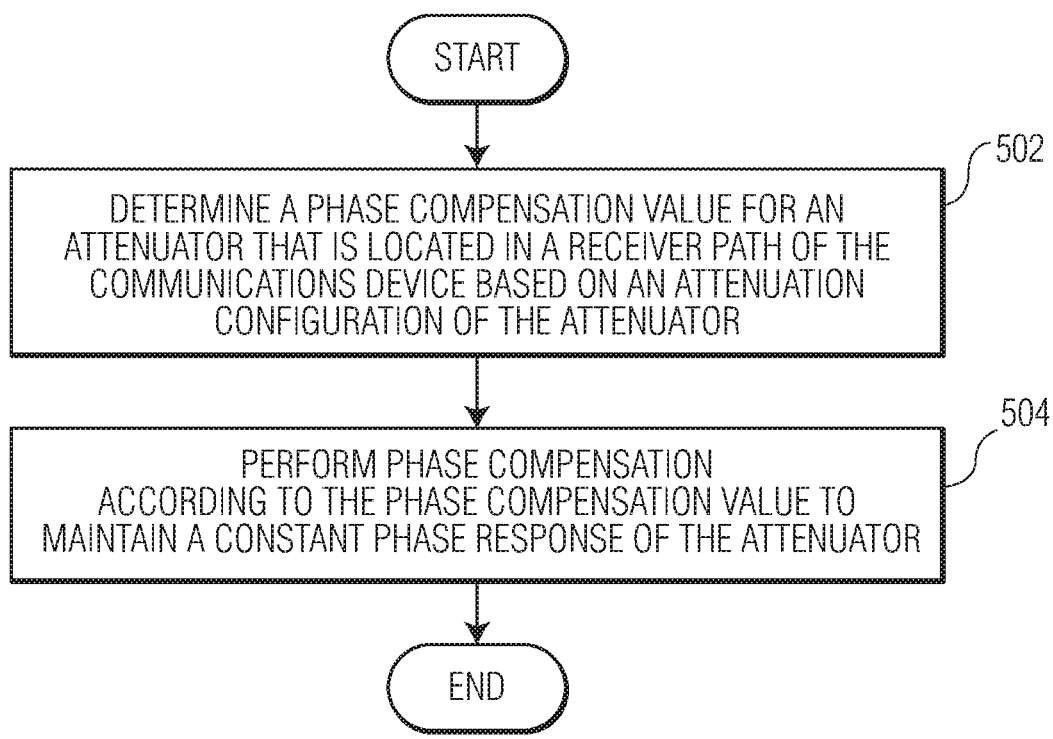
FIG. 5 is a process flow diagram of a method for AGC-based attenuator phase compensation in accordance with an embodiment of the invention.

FIG. 5 is a process flow diagram of a method for attenuator phase compensation in a communications device that communicates via inductive coupling in accordance with another embodiment of the invention. At block 502, a phase compensation value for an attenuator that is located in a receiver path of the communications device is determined based on an attenuation configuration of the attenuator. At block 504, phase compensation is performed according to the phase compensation value to maintain a constant phase response of the attenuator. The attenuator may be the same or similar to the attenuator 102 depicted in FIG. 1 and/or the AGC-based RF attenuator 302 depicted in FIG. 3. The communications device may be the same or similar to the communications device 220 depicted in FIG. 2.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

The computer-useable or computer-readable medium can be an electronic, magnetic, optical, electromagnetic, infrared, or semiconductor system (or apparatus or device), or a propagation medium. Examples of a computer-readable medium include a semiconductor or solid-state memory, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for attenuator phase compensation, the method comprising:
    determining a phase compensation value for an attenuator based on a function of a received attenuation configuration of the attenuator, wherein the received attenuation configuration of the attenuator comprises an adjustable impedance value of the attenuator; and
    performing phase compensation according to the phase compensation value to maintain a constant phase response.

2. The method of claim 1, wherein determining the phase compensation value for the attenuator comprises determining the phase compensation value for the attenuator from a predetermined table of different phase compensation values and attenuation configurations of the attenuator.

3. The method of claim 1, wherein determining the phase compensation value for the attenuator comprises determining the phase compensation value for the attenuator from a predetermined table of different phase compensation values and adjustable impedance configurations of the attenuator based on the adjustable impedance value of the attenuator.

4. The method of claim 1, wherein the received attenuation configuration of the attenuator comprises the attenuation factor code of the attenuator.

5. The method of claim 4, wherein determining the phase compensation value for the attenuator comprises determining the phase compensation value for the attenuator from a predetermined table of different phase compensation values and attenuation factor codes of the attenuator.

6. The method of claim 4, wherein determining the phase compensation value for the attenuator comprises determining the phase compensation value for the attenuator based on a function of the attenuation factor code of the attenuator.

7. A system for attenuator phase compensation, the system comprising:
    a phase compensation determination unit configured to determine a phase compensation value for an attenuator based on a function of a received attenuation configuration of the attenuator, wherein the received attenuation configuration of the attenuator comprises an adjustable impedance value of the attenuator; and
    a phase compensation unit configured to perform phase compensation according to the phase compensation value to maintain a constant phase response.

8. The system of claim 7, wherein the phase compensation determination unit is further configured to determine the phase compensation value for the attenuator from a predetermined table of different phase compensation values and attenuation configurations of the attenuator.

9. The system of claim 7, wherein the phase compensation determination unit is further configured to determine the phase compensation value for the attenuator from a predetermined table of different phase compensation values and adjustable impedance configurations of the attenuator based on the adjustable impedance value of the attenuator.

10. The system of claim 7, wherein the received attenuation configuration of the attenuator comprises the attenuation factor code of the attenuator.

11. The system of claim 10, wherein the phase compensation determination unit is further configured to determine the phase compensation value for the attenuator from a predetermined table of different phase compensation values and attenuation factor codes of the attenuator.

12. The system of claim 10, wherein the phase compensation determination unit is further configured to determine the phase compensation value for the attenuator based on a function of the attenuation factor code of the attenuator.

13. A method for attenuator phase compensation in a communications device that communicates via inductive coupling, the method comprising:
    determining a phase compensation value for an attenuator that is located in a receiver path of the communications device based on a function of a received attenuation configuration of the attenuator, wherein the received attenuation configuration of the attenuator comprises an adjustable impedance value of the attenuator; and performing phase compensation according to the phase compensation value to maintain a constant phase response of the attenuator.

14. The method of claim 13, wherein determining the phase compensation value for the attenuator comprises determining the phase compensation value for the attenuator from a predetermined table of different phase compensation values and attenuation configurations of the attenuator.

15. The method of claim 13, wherein the received attenuation configuration of the attenuator comprises the attenuation factor code of the attenuator.

* * * * *